(12) United States Patent
Fenouillet-Beranger et al.

(10) Patent No.: US 9,165,908 B2
(45) Date of Patent: Oct. 20, 2015

(54) ON-SOI INTEGRATED CIRCUIT COMPRISING A TRIAC FOR PROTECTION AGAINST ELECTROSTATIC DISCHARGES

(71) Applicants: Commissariat à l'énergie atomique et aux énergies alternatives, Paris (FR); STMicroelectronics SA, Crolles (FR)

(72) Inventors: Claire Fenouillet-Beranger, Grenoble (FR); Pascal Fonteneau, Theys (FR)

(73) Assignees: COMMISSARIAT À L'ÉNERGIE ATOMIQUE ET AUX ENERGIES ALTERNATIVES, Paris (FR); STMicroelectronics SA, Montrouge (FR)

( * ) Notice: Subject to any disclaimer, the term of this patent is extended or adjusted under 35 U.S.C. 154(b) by 156 days.

(21) Appl. No.: 13/932,134

(22) Filed: Jul. 1, 2013

(65) Prior Publication Data

US 2014/0017821 A1   Jan. 16, 2014

(30) Foreign Application Priority Data

Jul. 13, 2012  (FR) ...................... 12 56801

(51) Int. Cl.
| | | |
|---|---|---|
| *H01L 21/70* | (2006.01) | |
| *H01L 25/07* | (2006.01) | |
| *H01L 27/02* | (2006.01) | |
| *H01L 27/12* | (2006.01) | |

(52) U.S. Cl.
CPC ............ *H01L 25/07* (2013.01); *H01L 27/0262* (2013.01); *H01L 27/1207* (2013.01)

(58) Field of Classification Search
CPC .. H01L 25/07; H01L 27/0262; H01L 27/1207
See application file for complete search history.

(56) References Cited

U.S. PATENT DOCUMENTS

| | | | |
|---|---|---|---|
| 2007/0063284 A1* | 3/2007 | Kawahara et al. | 257/351 |
| 2009/0134468 A1* | 5/2009 | Tsuchiya et al. | 257/368 |
| 2010/0084709 A1* | 4/2010 | Tsuchiya et al. | 257/347 |

FOREIGN PATENT DOCUMENTS

| | | |
|---|---|---|
| WO | 2010/112585 | 10/2010 |
| WO | 2011/089179 | 7/2011 |

OTHER PUBLICATIONS

J.P. Noel et al., "Multi-VT UTBB FDSOI Device Architectures for Low-Power CMOS Circuit," IEEE Transactions on Electron Devices, vol. 58, pp. 2473-2482 (2011).
J.P. Noel et al., "UT2B-FDSOI device architecture dedicated to low power design techniques," Proceedings of IEEE ESSDERC (2010).

* cited by examiner

*Primary Examiner* — Whitney T Moore
*Assistant Examiner* — Joseph Galvin, III
(74) *Attorney, Agent, or Firm* — Occhiuti & Rohlicek LLP

(57) ABSTRACT

An integrated circuit includes four electronic components, a buried UTBOX layer under and plumb with the electronic components, and two pairs of oppositely doped ground planes plumb with corresponding components under the layer. A first isolation trench mutually isolates the ground planes from corresponding wells made plumb and in contact with the ground planes and exhibiting the first doping type. Bias electrodes contact respective wells and ground planes. One pair of electrodes is for connecting to a first bias voltage and the other pair is for connecting to a second bias voltage. Also included are a semiconductor substrate exhibiting the first type of doping and a deeply buried well exhibiting the second type of doping. The deeply buried well contacts the other wells and separates them from the substrate. Finally, a control electrode couples to the deeply buried well.

14 Claims, 2 Drawing Sheets

US 9,165,908 B2

ON-SOI INTEGRATED CIRCUIT COMPRISING A TRIAC FOR PROTECTION AGAINST ELECTROSTATIC DISCHARGES

RELATED APPLICATIONS

Under 35 USC 119, this application claims the benefit of the priority date of French Application No. 1256801, filed on Jul. 13, 2012, the contents of which are herein incorporated by reference.

FIELD OF INVENTION

The invention relates to integrated circuits, and in particular to integrated circuits produced on a substrate of silicon-on-insulator (SOI) type. SOI technology consists in separating a slender silicon layer (a few nanometres) on a silicon substrate by a relatively thick layer of insulant (a few tens of nanometres as a general rule).

BACKGROUND

Integrated circuits produced by SOI technology exhibit a certain number of advantages. Such circuits generally exhibit lower electrical consumption for equivalent performance. Such circuits also induce lower parasitic capacitances, which make it possible to improve switching speed. Moreover, the phenomenon of parasitic triggering ("latchup") encountered by MOS transistors in Bulk technology can be avoided. Such circuits therefore turn out to be particularly suitable for applications of SoC or MEMS type. It is also noted that SOI integrated circuits are less sensitive to the effects of ionizing radiations and thus turn out to be more reliable in applications where such radiations may induce operational problems, in particular in space applications. SOI integrated circuits can in particular comprise random-access memories of SRAM type or logic gates.

The reduction in the static consumption of logic gates while increasing their toggling speed forms the subject of much research. Certain integrated circuits currently being developed integrate at one and the same time logic gates with low consumption and logic gates with high toggling speed. To generate these two types of logic gates on one and the same integrated circuit, the threshold voltage of certain transistors of the logic gates with fast access is lowered, and the threshold voltage of other transistors of the logic gates with low consumption is increased. In Bulk technology, the modulation of the threshold voltage level of transistors of the same type is performed by differentiating the doping level of their channel. However, in FDSOI (for "Fully Depleted Silicon On Insulator") technology, the doping of the channel is almost zero ($10^{15}$ cm$^{-3}$). Thus, the doping level of the channel of the transistors therefore cannot exhibit any significant variations, thus preventing the threshold voltages from being differentiated in this way. A solution proposed in certain studies in order to produce transistors of the same type with distinct threshold voltages is to integrate different gate materials for these transistors. However, the practical production of an integrated circuit such as this turns out to be technically tricky and economically prohibitive.

In order to have distinct threshold voltages for different transistors in FDSOI technology, it is also known to use a biased ground plane disposed between a thin insulating oxide layer and the silicon substrate. By altering the doping of the ground planes and their bias, it is possible to define a range of threshold voltages for the different transistors. This will therefore yield transistors with low threshold voltage termed LVT (for "Low $V_T$", typically 400 mV), transistors with high threshold voltage termed HVT (for "High $V_T$", typically 550 mV) and transistors with medium threshold voltage termed SVT (for "Standard $V_T$", typically 450 mV) or RVT (for "Regular $V_T$").

To allow the operation of the different transistors, it is necessary to electrically insulate them from one another. Consequently, the transistors are generally surrounded by isolation trenches (designated by the acronym STI for "Shallow Trench Isolation") which extend as far as the wells.

In a known manner, integrated circuits such as these also include devices for protection against accidental electrostatic discharges (ESD) that might impair these transistors.

The following documents are known from the prior art:
US 2009/134468 A1;
US 2007/063284 A1;
WO 2010/112585 A1;
J. P. Noel et al., "Multi-VT UTBB FDSOI Device 10 Architectures for Low-Power CMOS Circuit"; IEEE Transactions on Electron Devices, vol. 58, p. 2473-2482, 1$^{st}$ August 2011;
J. P. Noel et al., "UT2B-FDSOI device architecture dedicated to low power design techniques"; Proceedings of IEEE ESSDERC 2010.
WO 2011/089179 A1.

There exists a need for protection against electrostatic discharges that is not detrimental to the compactness of the integrated circuit, capable of evacuating a localized discharge whatever its polarity, and inexpensive.

SUMMARY OF THE INVENTION

In one aspect, the invention features a manufacture including an integrated circuit. The integrated circuit includes first, second, third, and fourth electronic components, a buried insulating layer of UTBOX type disposed under and plumb with the electronic components, first, second, third, and fourth ground planes made plumb respectively with the first, second, third, and fourth electronic components under the buried insulating layer, the first and fourth ground planes exhibiting a first type of doping, the second and third ground planes exhibiting a second type of doping opposite to the first type of doping, a first isolation trench mutually isolating the first, second, third, and fourth ground planes, first, second, third, and fourth wells respectively made plumb and in contact with the first, second, third, and fourth ground planes and exhibiting the first type of doping, first, second, third, and fourth bias electrodes in contact respectively with the first, second, third, and fourth wells and with the first, second, third, and fourth ground planes, the first and third electrodes being suitable for being connected to a first bias voltage and the second and fourth electrodes being suitable for being connected to a second bias voltage different from the first bias voltage, a semiconducting substrate exhibiting the first type of doping, a deeply buried well exhibiting the second type of doping, the deeply buried well being in contact with the first, second, third, and fourth wells and separating the first, second, third, and fourth wells from the substrate, and a control electrode coupled to the deeply buried well.

In one embodiment, the first, second, third, and fourth bias electrodes and the first, second, third, and fourth ground planes are coplanar.

Among these embodiments are those in that further include a second isolation trench extending plumb with the respective contacts between the first, second, third, and fourth ground planes and the first, second, third, and fourth bias electrodes. In some of these embodiments, the second isolation trench extends through the buried insulating layer, and into one of the ground planes and to a depth less than the interface between the ground planes and the wells.

Also included are embodiments in which the first, second, third, and fourth electronic components are transistors of FDSOI type. Among these are embodiments in which the first and third electronic components are nMOS transistors and wherein the second and fourth electronic components are pMOS transistors.

These include embodiments in which the first and second electronic components are coupled to form a logic inverter forming an input/output interface of the integrated circuit. Also included among these embodiments are those in which the first and second ground planes are coupled to respective sources of the transistors of the first and second electronic components.

Yet other embodiments include an electrostatic discharge detection device configured to detect an electrostatic discharge and to apply a control signal to the control electrode upon detection of the electrostatic discharge. These embodiments include those in which the electrostatic discharge detection device includes the third and fourth electronic components and also those in which the first and third electronic components are disposed on a first side of the control electrode and the second and fourth electronic components are disposed on a second side of the control electrode, the control electrode being insulated from the first, second, third, and fourth ground planes and insulated from the first, second, third, and fourth electrodes by way of the first isolation trench.

Yet other embodiments include those in which the first and second bias voltages are an electrical ground voltage and a supply voltage of the integrated circuit.

In additional embodiments, the first, second, third, and fourth bias electrodes include a semi-conducting implant having a dopant concentration at least fifty times greater than a dopant concentration the first, second, third, and fourth wells.

Also among the embodiments are those in which the first type of doping is P type doping.

BRIEF DESCRIPTION OF THE DRAWINGS

Other characteristics and advantages of the invention will emerge clearly from the description thereof given hereinafter, by way of wholly nonlimiting indication, with reference to the appended drawings, in which.

DETAILED DESCRIPTION OF THE INVENTION

The invention proposes to use, in an integrated circuit, isolation trenches of reduced depth and dimensions to produce ESD protection devices for an integrated circuit. Such protection devices, made under the electronic components, are not detrimental to the integration density of the circuit and make it possible to ensure localized protection, whatever the polarity of the electrostatic discharge.

Figure 1:
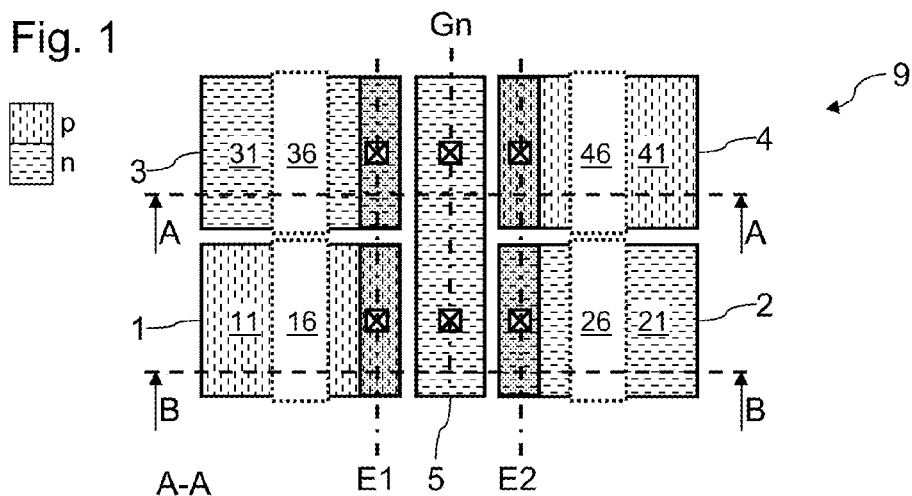
FIG. 1 is a schematic plan view of a portion of integrated circuit at the level of ground planes.
Figure 2:
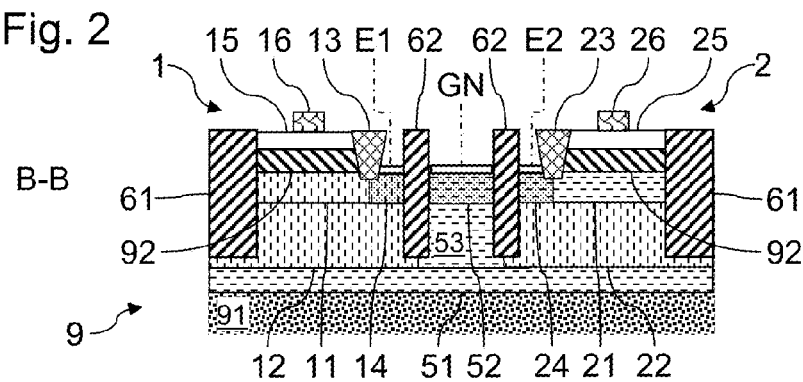
FIG. 2 is a sectional view of the circuit at the level of a first cell.
Figure 4:
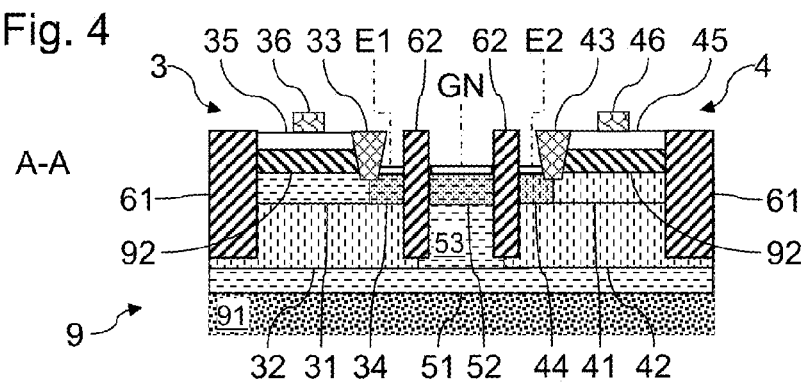
FIG. 4 is a sectional view of the circuit at the level of a second cell.

FIG. 1 is a schematic plan view of a portion of an integrated circuit 9 fabricated on SOI. The integrated circuit 9 here comprises a first cell comprising electronic components 1 and 2, and a second cell comprising electronic components 3 and 4. FIGS. 2 and 4 are respective cross-sectional views of the first and second cells. The electronic components 1 to 4 are produced in a layer of a semi-conducting material, termed the active layer, formed on an insulating layer 92, this insulating layer 92 being formed plumb with a semi-conducting substrate 91 with doping of type p.

In this instance the electronic components 1 to 4 are field-effect transistors of FDSOI type. The components 1 to 4 can also be FEDs (for "Field Effect Diode"), FERs (for "Field Effect Rectifier"), or $Z^2$—FETs.

The transistors 1 and 3 are for example nMOS transistors and the transistors 2 and 4 are for example pMOS transistors. The transistors are generally aligned in a row of cells each including an nMOS transistor and a pMOS transistor. The nMOS transistors of the various cells are then aligned.

The transistors 1 to 4 comprise in a manner known per se a source, a drain and a channel, and a gate stack produced plumb with the channel. The source, the drain and the channel of the transistors 1 to 4 are made respectively in semi-conducting active layers 15, 25, 35 and 45. The transistors 1 to 4 comprise respective gate stacks 16, 26, 36 and 46 disposed respectively on the semi-conducting active layers 15, 25, 35 and 45, plumb with the channel. To simplify the drawings, the detailed structure of the active layers is not represented therein. The transistors of the active layer can comprise in a manner known per se a channel made of weakly doped semi-conducting material, with a concentration of dopants that is substantially equal to the concentration of dopants of the substrate 91. The transistors 1 to 4 also comprise respective source and drain electrodes, not illustrated.

Semi-conducting ground planes 11, 21, 31 and 41 are formed respectively plumb with the transistors 1 to 4, under the buried insulating layer 92. The doping of the ground plane 11 is of type p, that of the ground plane 21 is of type n, that of the ground plane 31 is of type n, and that of the ground plane 41 is of type p.

The ground planes 11, 21, 31 and 41 are biased respectively via semi-conducting implants 14, 24, 34 and 44. The implants 14, 24, 34 and 44 exhibit respective dopings of type p, n, n and p (and preferably P+, N+, N+ and P+ dopings respectively). The biasing of the ground planes can be performed by way of a control circuit, not represented here. The implants 14, 24, 34 and 44 are coplanar with the ground planes 11, 21, 31 and 41. Coplanar is understood to mean that it is possible to define a plane parallel to the layer 92 and passing through the zones concerned.

Semi-conducting wells 12, 22, 32 and 42 are formed respectively, plumb with the ground planes 11, 21, 31 and 41. The doping of the wells 12, 22, 32 and 42 is of type p.

A deeply buried well 51 with doping of type n forms a separation between the wells 12, 22, 32 and 42 and the substrate 91 with doping of type p.

The buried insulating layer 92 electrically isolates the transistors 1 to 4 from their ground plane, from their well, and from the substrate 91.

The buried insulating layer 92 formed plumb with the transistors is here of UTBOX type ("Ultra-Thin Buried Oxide Layer"). Thus, the control of the bias of the ground planes 11, 21, 31 and 41 makes it possible to modulate the respective threshold voltages of the transistors 1 to 4. The insulating layer 92 exhibits for example a thickness of less than or equal to 60 nm, less than or equal to 50 nm, or indeed less than or equal to 20 nm. The insulating layer 92 can be produced in a manner known per se from silicon oxide.

Deep isolation trenches 61 and 62 are made at the periphery of each of the transistors 1 to 4. The isolation trenches 61 and 62 extend depth-wise through the insulating layer 92 and into the respective wells 12, 22, 32 and 42 for the transistors 1 to 4.

The transistors 1 to 4 furthermore comprise isolation trenches 13, 23, 33 and 43 respectively. The isolation trenches 13, 23, 33 and 43 are made plumb with the contact between the ground planes 11, 21, 31 and 41 and the implants 14, 24, 34 and 44 respectively. The isolation trenches 13, 23, 33 and 43 are not as deep as the isolation trenches 61 and 62. The isolation trenches 13, 23, 33 and 43 do not extend as far as their respective wells 12, 22, 32 and 42. The isolation trenches 13, 23, 33 and 43 here pass through the insulating layer 92 and therefore extend into their respective ground planes 11, 21, 31 and 41. The isolation trenches 13, 23, 33 and 43 make it possible to improve the insulation between the transistors 1 to 4 and their implants 14, 24, 34 and 44.

The implants 14, 24, 34 and 44 are here made laterally with respect to the transistors 1 to 4. The implants 14 and 34 are biased to a first voltage level E1. The implants 24 and 44 are biased to a second voltage level E2, different from E1. A device 5 for protection against electrostatic discharges is included in the integrated circuit 9. The protection against electrostatic discharges is aimed at ensuring protection against the discharges between the voltage levels E1 and E2.

The protection device 5 for protection against electrostatic discharges here comprises an implant 52. The implant 52 is here doped type n (N+ doping in this instance). The implant 52 is coplanar here with the implants 14, 24, 34 and 44. The implant 52 extends over the first and second cells, between the isolation trenches 62.

The protection device 5 furthermore comprises a well 53 disposed plumb with the implant 52. The well 53 comprises the same type of doping as the implant 52, here a doping of type n. The well 53 is coplanar here with the wells 12, 22, 32 and 42. The well 53 extends more deeply than the isolation trenches 62 and is in contact with the wells 12, 22, 32 and 42. The well 53 extends into contact with the deeply buried well 51. A control potential GN can be applied to the well 53.

Figure 3:
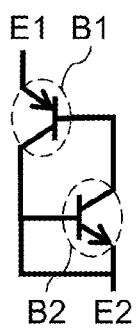
FIG. 3 is an equivalent electrical diagram of a lower protection circuit for the first cell.

In the first cell, the protection device 5 forms the equivalent electrical diagram illustrated in FIG. 3. Bipolar transistors B1 and B2 are formed. The bipolar transistor B1 is a pnp transistor and the transistor B2 is an npn transistor.

For the transistor B1:
the emitter is formed by the implant 14 and the well 12, and is at the potential E1;
the base is formed by the implant 52, the well 53 and the well 51, and is at the potential GN;
the collector is formed by the well 22, and is at the potential E2.

For the transistor B2:
the emitter is formed by the implant 24, and is at the potential E2;
the base is formed by the well 22, and is at the potential E2;
the collector is formed by the implant 52, the well 53 and the well 51, and is at the potential GN.

Figure 5:
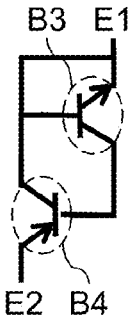
FIG. 5 is an equivalent electrical diagram of a lower protection circuit for the second cell.

In the second cell, the protection device 5 forms the equivalent electrical diagram illustrated in FIG. 5. Bipolar transistors B3 and B4 are formed. The bipolar transistor B3 is an npn transistor and the transistor B4 is a pnp transistor.

For the transistor B3:
the emitter is formed by the implant 34, and is at the potential E1;
the base is formed by the well 32, and is at the potential E1;
the collector is formed by the implant 52, the well 53 and the well 51, and is at the potential GN.

For the transistor B4:
the emitter is formed by the implant 44 and the well 42, and is at the potential E2;
the base is formed by the implant 52, the well 53 and the well 51, and is at the potential GN;
the collector is formed by the well 32, and is at the potential E1.

Figure 6:
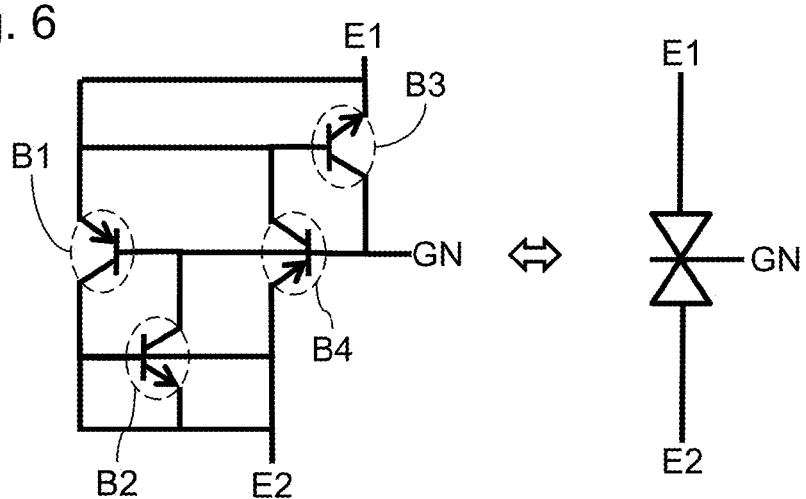
FIG. 6 illustrates the electrical diagram equivalent to the cell protection circuits.

FIG. 6 illustrates an equivalent electrical diagram, which shows that the combination of the transistors B1 to B4 forms a triac. The implant 52, the well 53 and the well 51 thus form a gate of the TRIAC formed in the integrated circuit 9. The gate of the TRIAC is thus controlled by the signal GN. The implants 14, 24, 34 and 44 intended to bias the ground planes 11, 21, 31 and 41 are used for the formation of the TRIAC. A particularly simple and inexpensive protection device 5 can thus be formed.

The TRIAC thus makes it possible to ensure protection against the electrostatic discharges between the potentials E1 and E2, whatever the polarity of the discharge. The potentials E1 and E2 can for example be respectively potentials at Vdd and at ground. The TRIAC thus formed is essentially housed under the transistors 1 to 4 and therefore only marginally affects the integration density of the integrated circuit.

The wells 12, 22, 32 and 42 can exhibit concentrations of dopants of between $10^{16}$ cm$^{-3}$ and $10^{18}$ cm$^{-3}$. The ground planes 11, 21, 31 and 41 can exhibit concentrations of dopants of between $10^{18}$ cm$^{-3}$ and $10^{19}$ cm$^{-3}$. The wells 12, 22, 32 and 42 can extend to a depth of less than 1 µm and, preferably, less than or equal to 700 nm.

Metallic contacts can be deposited directly on each of the implants 14, 24, 34, 44 and 52, in order to allow electrical connection of each of them. Advantageously, the implants 14, 24, 34, 44 and 52 each exhibit a concentration of dopants at least fifty times, or a hundred times, greater than the concentration of dopants of the wells 12, 22, 32 and 42. For example, the implants 14, 24, 34, 44 and 52 exhibit concentrations of dopants that are advantageously greater than or equal to $5*10^{18}$ cm$^{-3}$ and, preferably, between $10^{19}$ cm$^{-3}$ and $10^{21}$ cm$^{-3}$. These concentrations of dopants are for example substantially equal to the concentrations of dopants of the source or of the drain of the transistors 1 to 4.

The signal GN can be generated by a circuit for detecting an electrostatic discharge, such a circuit being known per se. The protection device 5 can be intended to locally protect the first and second cells made plumb with, or intended to form a centralized protection of, the integrated circuit 9.

Figure 7:
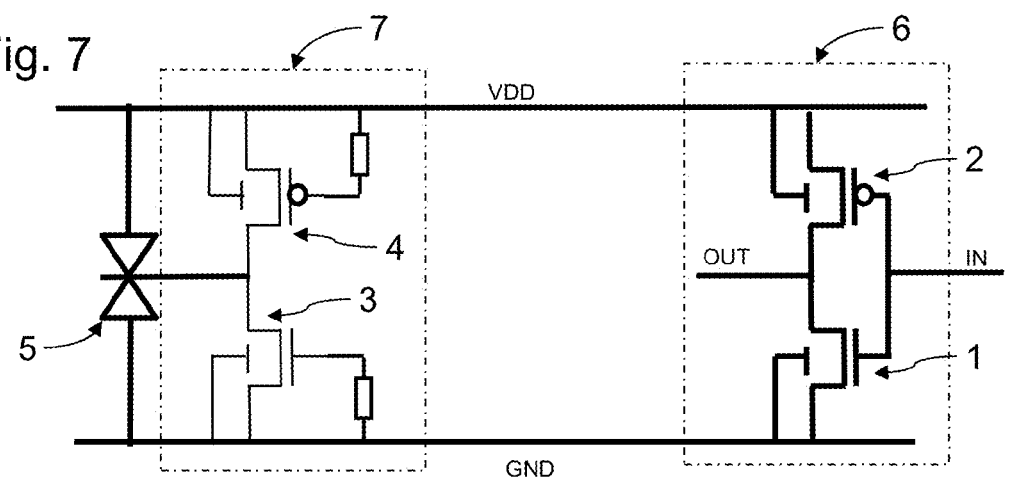
FIG. 7 is a schematic representation of an exemplary integrated protection device plumb with a cell to be protected.

FIG. 7 schematically illustrates an example in which the protection device 5 ensures localized protection of the first cell. The first cell is here a logic inverter 6 of CMOS ("Complementary Metal Oxide Semiconductor") type. The inverter 6 exhibits an input IN, configured to receive an input logic signal and an output OUT, configured to return a logic signal corresponding to the logical inverse of the input signal. The inverter 6 can in particular be used as input/output interface of the integrated circuit 9. The protection device 5 here ensures protection against electrostatic discharges between a power supply rail at Vdd and a power supply rail at the ground voltage. In this example,
the respective gates of the transistors 1 and 2 of the first cell are connected together electrically and connected electrically to the input IN, the respective drains of the transistors 1 and 2 are connected electrically together and connected electrically to the output OUT, and the sources of the transistors 1 and 2 are, respectively, electrically biased and at a ground GND and at a supply voltage VDD of the integrated circuit 9;

the substrate 91 is connected electrically to the ground GND.

The second cell forms a control circuit 7 for the protection device 5. The nMOS transistor 3 has it gate connected electrically to the ground GND by way of a resistance. The ground plane 31 is connected to the potential of the gate of the transistor 3. The source of the transistor 3 is connected to the ground GND. The drain of the transistor 3 is connected to the gate of the TRIAC of the protection device 5. The pMOS transistor 4 has its gate connected electrically to the supply voltage Vdd by way of a resistance. The ground plane 41 is connected to the potential of the gate of the transistor 4. The source of the transistor 4 is connected to the voltage Vdd. The drain of the transistor 4 is connected to the gate of the TRIAC. The said resistances can be for example fixed at a desired value by altering the depth of the isolation trenches 13, 23, 33, 43 below the buried insulating layer 92. The deeper these isolation trenches 13, 23, 33, 43, the higher the value of resistance between gate and implant.

As a function of the polarity of an electrostatic discharge between the power supply rails at Vdd and at Gnd, either the transistor 3, or the transistor 4 is rendered passing, in such a way as to trigger the TRIAC. Once the TRIAC is rendered passing, the electrostatic discharge between the power supply rails at Vdd and at Gnd passes through the TRIAC, the first cell thus being protected against this discharge.

The invention claimed is:

1. A manufacture comprising an integrated circuit, said integrated circuit comprising first, second, third, and fourth electronic components, a buried insulating layer of UTBOX type disposed under and plumb with said electronic components, first, second, third, and fourth ground planes made plumb respectively with said first, second, third, and fourth electronic components under said buried insulating layer, said first and fourth ground planes exhibiting a first type of doping, said second and third ground planes exhibiting a second type of doping opposite to said first type of doping, a first isolation trench mutually isolating said first, second, third, and fourth ground planes, first, second, third, and fourth wells respectively made plumb and in contact with said first, second, third, and fourth ground planes and exhibiting said first type of doping, first, second, third, and fourth bias electrodes in contact respectively with said first, second, third, and fourth wells and with said first, second, third, and fourth ground planes, said first and third electrodes being suitable for being connected to a first bias voltage and said second and fourth electrodes being suitable for being connected to a second bias voltage different from said first bias voltage, a semiconducting substrate exhibiting said first type of doping, a deeply buried well exhibiting said second type of doping, said deeply buried well being in contact with said first, second, third, and fourth wells and separating said first, second, third, and fourth wells from said substrate, and a control electrode coupled to said deeply buried well.

2. The manufacture of claim 1, wherein said first, second, third, and fourth bias electrodes and said first, second, third, and fourth ground planes are coplanar.

3. The manufacture of claim 2, further comprising a second isolation trench extending plumb with said respective contacts between said first, second, third, and fourth ground planes and said first, second, third, and fourth bias electrodes.

4. The manufacture of claim 3, wherein said second isolation trench extends through said buried insulating layer, and into one of said ground planes and to a depth less than said interface between said ground planes and said wells.

5. The manufacture of claim 1, wherein said first, second, third, and fourth electronic components are transistors of FDSOI type.

6. The manufacture of claim 5, wherein said first and third electronic components are nMOS transistors and wherein said second and fourth electronic components are pMOS transistors.

7. The manufacture of claim 6, wherein said first and second electronic components are coupled to form a logic inverter forming an input/output interface of said integrated circuit.

8. The manufacture of claim 7, wherein said first and second ground planes are coupled to respective sources of said transistors of said first and second electronic components.

9. The manufacture of claim 1, further comprising an electrostatic discharge detection device configured to detect an electrostatic discharge and to apply a control signal to said control electrode upon detection of said electrostatic discharge.

10. The manufacture of claim 9, wherein said electrostatic discharge detection device comprises said third and fourth electronic components.

11. The manufacture of claim 9, wherein said first and third electronic components are disposed on a first side of said control electrode and said second and fourth electronic components are disposed on a second side of said control electrode, said control electrode being insulated from said first, second, third, and fourth ground planes and insulated from said first, second, third, and fourth electrodes by way of said first isolation trench.

12. The manufacture of claim 1, wherein said first and second bias voltages include an electrical ground voltage and a supply voltage of said integrated circuit.

13. The manufacture of claim 1, wherein said first, second, third, and fourth bias electrodes include a semi-conducting implant having a dopant concentration at least fifty times greater than a dopant concentration of said first, second, third, and fourth wells.

14. The manufacture of claim 1, wherein said first type of doping is P type doping.

* * * * *